(12) United States Patent
Sabri et al.

(10) Patent No.: US 9,449,795 B2
(45) Date of Patent: Sep. 20, 2016

(54) CERAMIC SHOWERHEAD WITH EMBEDDED RF ELECTRODE FOR CAPACITIVELY COUPLED PLASMA REACTOR

(71) Applicant: Novellus Systems, Inc., San Jose, CA (US)

(72) Inventors: Mohamed Sabri, Beaverton, OR (US); Edward Augustyniak, Tualatin, OR (US); Douglas L. Keil, West Linn, OR (US); Ramkishan Rao Lingampalli, Dublin, CA (US); Karl Leeser, Lake Oswego, OR (US); Cody Barnett, Portland, OR (US)

(73) Assignee: NOVELLUS SYSTEMS, INC., San Jose, CA (US)

( * ) Notice: Subject to any disclaimer, the term of this patent is extended or adjusted under 35 U.S.C. 154(b) by 687 days.

(21) Appl. No.: 13/858,477

(22) Filed: Apr. 8, 2013

(65) Prior Publication Data

US 2014/0238608 A1 Aug. 28, 2014

Related U.S. Application Data

(60) Provisional application No. 61/770,894, filed on Feb. 28, 2013.

(51) Int. Cl.
*C23C 16/505* (2006.01)
*C23C 16/509* (2006.01)
*H01J 37/32* (2006.01)

(52) U.S. Cl.
CPC ......... *H01J 37/3244* (2013.01); *C23C 16/505* (2013.01); *C23C 16/509* (2013.01); *H01J 37/32091* (2013.01)

(58) Field of Classification Search
CPC ............... C23C 16/505; C23C 16/509; H01J 37/3244; H01J 37/32091
USPC ........ 118/723 E; 156/345.43, 345.46, 345.47
See application file for complete search history.

(56) References Cited

U.S. PATENT DOCUMENTS 5,366,585 A * 11/1994 Robertson ........... C23C 16/4404
134/1
5,567,243 A * 10/1996 Foster .................... C23C 16/04
118/723 E (Continued)

FOREIGN PATENT DOCUMENTS

CN 101620989 A 1/2010
JP 11214195 A 8/1999

(Continued)

OTHER PUBLICATIONS

Notification Concerning Transmittal of International Preliminary Report on Patentability for PCT/US2012/052789 filed Aug. 29, 2012; 9 pages.

(Continued)

*Primary Examiner* — Rudy Zervigon

(57) ABSTRACT

A showerhead assembly for a substrate processing system includes a back plate connected to a gas channel. A face plate is connected adjacent to a first surface of the back plate and includes a gas diffusion surface. An electrode is arranged in one of the back plate and the face plate and is connected to one or more conductors. A gas plenum is defined between the back plate and the face plate and is in fluid communication with the gas channel. The back plate and the face plate are made of a non-metallic material.

22 Claims, 5 Drawing Sheets

(56) References Cited

U.S. PATENT DOCUMENTS

| | | | | |
|---|---|---|---|---|
| 5,628,829 | A * | 5/1997 | Foster | C23C 16/4417 118/723 E |
| 5,637,146 | A * | 6/1997 | Chyi | C30B 25/105 117/108 |
| 5,680,013 | A * | 10/1997 | Dornfest | H01J 37/32559 118/723 E |
| 5,772,770 | A * | 6/1998 | Suda | C23C 16/4401 118/719 |
| 5,959,409 | A * | 9/1999 | Dornfest | H01J 37/32495 118/723 E |
| 5,996,528 | A * | 12/1999 | Berrian | C23C 16/45565 118/723 E |
| 6,095,085 | A | 8/2000 | Agarwal | |
| 6,120,640 | A * | 9/2000 | Shih | C23C 28/044 118/719 |
| 6,120,661 | A * | 9/2000 | Hirano | C03C 15/00 118/723 R |
| 6,415,736 | B1 * | 7/2002 | Hao | H01L 21/67017 118/723 E |
| 6,453,992 | B1 * | 9/2002 | Kim | C23C 16/45565 118/666 |
| 6,494,958 | B1 | 12/2002 | Shamouilian et al. | |
| 6,506,254 | B1 * | 1/2003 | Bosch | H01J 37/32477 118/715 |
| 6,634,314 | B2 | 10/2003 | Hwang et al. | |
| 6,783,627 | B1 * | 8/2004 | Mahawili | C23C 8/36 118/723 IR |
| 6,902,620 | B1 | 6/2005 | Omstead et al. | |
| 7,153,542 | B2 | 12/2006 | Nguyen et al. | |
| 7,337,745 | B1 * | 3/2008 | Komino | H01L 21/6831 118/723 E |
| 7,661,386 | B2 * | 2/2010 | Kasai | C23C 16/45565 118/666 |
| 7,712,434 | B2 * | 5/2010 | Dhindsa | H01J 37/32009 118/723 E |
| 7,749,353 | B2 * | 7/2010 | Rusu | H01J 37/32082 156/345.43 |
| 7,802,539 | B2 * | 9/2010 | Bosch | C04B 41/0054 118/723 E |
| 8,043,842 | B2 | 10/2011 | Blattner et al. | |
| 8,083,855 | B2 * | 12/2011 | Dhindsa | C23C 16/4557 118/715 |
| 8,137,467 | B2 * | 3/2012 | Meinhold | C23C 16/45565 118/663 |
| 8,216,486 | B2 * | 7/2012 | Dhindsa | C23C 16/4557 118/715 |
| 8,443,756 | B2 * | 5/2013 | Fischer | C23C 16/45565 118/723 E |
| 8,733,279 | B2 * | 5/2014 | White | C23C 16/44 118/715 |
| 2001/0047760 | A1 * | 12/2001 | Moslehi | H01J 37/321 118/723 I |
| 2002/0017243 | A1 * | 2/2002 | Pyo | C23C 16/18 118/715 |
| 2003/0196760 | A1 * | 10/2003 | Tyler | H01J 37/32082 156/345.47 |
| 2003/0205202 | A1 * | 11/2003 | Funaki | C23C 16/4404 118/723 E |
| 2004/0000378 | A1 | 1/2004 | Lee et al. | |
| 2004/0065255 | A1 | 4/2004 | Yang et al. | |
| 2004/0074609 | A1 * | 4/2004 | Fischer | H01J 37/32541 156/345.1 |
| 2004/0149212 | A1 * | 8/2004 | Cho | C23C 16/45561 118/715 |
| 2004/0187779 | A1 * | 9/2004 | Park | C23C 16/4404 118/715 |
| 2005/0173569 | A1 * | 8/2005 | Noorbakhsh | C23C 16/45565 239/690 |
| 2005/0241765 | A1 * | 11/2005 | Dhindsa | H01J 37/32009 156/345.34 |
| 2006/0057303 | A1 | 3/2006 | Agarwal et al. | |
| 2007/0031236 | A1 | 2/2007 | Chen | |
| 2007/0137573 | A1 * | 6/2007 | Kholodenko | H01J 37/32091 118/723 E |
| 2007/0256785 | A1 * | 11/2007 | Pamarthy | H01J 37/3244 156/345.33 |
| 2007/0266945 | A1 * | 11/2007 | Shuto | C23C 16/4585 118/723 E |
| 2008/0075858 | A1 | 3/2008 | Koh | |
| 2008/0196666 | A1 * | 8/2008 | Toshima | C23C 16/45565 118/723 E |
| 2008/0241517 | A1 * | 10/2008 | Kenworthy | B32B 15/01 428/332 |
| 2009/0000743 | A1 * | 1/2009 | Iizuka | H01J 37/32091 156/345.34 |
| 2009/0095219 | A1 * | 4/2009 | Meinhold | C23C 16/45565 118/708 |
| 2010/0000684 | A1 | 1/2010 | Choi | |
| 2011/0198417 | A1 * | 8/2011 | Detmar | H01J 37/321 239/569 |
| 2012/0097330 | A1 * | 4/2012 | Iyengar | C23C 16/45565 156/345.34 |
| 2012/0220109 | A1 * | 8/2012 | Komori | C23C 16/24 438/478 |
| 2012/0222815 | A1 * | 9/2012 | Sabri | C23C 16/45565 156/345.34 |
| 2012/0225193 | A1 | 9/2012 | Yudovsky | |
| 2012/0225195 | A1 | 9/2012 | Yudovsky | |
| 2013/0092086 | A1 * | 4/2013 | Keil | H01J 37/3255 118/723 E |
| 2013/0269609 | A1 | 10/2013 | Leeser | |
| 2013/0344245 | A1 * | 12/2013 | Xia | C23C 16/4401 427/255.7 |
| 2014/0116338 | A1 * | 5/2014 | He | C23C 14/028 118/723 E |
| 2014/0165911 | A1 * | 6/2014 | Kao | H01J 37/32009 118/723 E |
| 2014/0238608 | A1 * | 8/2014 | Sabri | H01J 37/32091 156/345.34 |

FOREIGN PATENT DOCUMENTS

| | | |
|---|---|---|
| KR | 10-0388530 B1 | 6/2003 |
| KR | 100565131 B1 | 3/2006 |
| KR | 20080001336 A | 1/2008 |
| KR | 10-0845896 B1 | 7/2008 |
| KR | 20100004857 A | 1/2010 |
| WO | WO-9943018 A1 | 8/1999 |

OTHER PUBLICATIONS

International Search Report and Written Opinion for PCT/US2012/052789 filed Aug. 28, 2012; 13 pages.
First Office Action dated Nov. 17, 2015 corresponding to Chinese Patent Application No. 201280062473.3, 8 pages.

* cited by examiner

CERAMIC SHOWERHEAD WITH EMBEDDED RF ELECTRODE FOR CAPACITIVELY COUPLED PLASMA REACTOR

CROSS-REFERENCE TO RELATED APPLICATIONS

This application claims the benefit of U.S. Provisional Application No. 61/770,894, filed on Feb. 28, 2013. The entire disclosure of the application referenced above is incorporated herein by reference.

FIELD

The present disclosure relates to substrate processing systems, and more particularly to showerheads for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems typically include a processing chamber with one or more reaction volumes. A pedestal is typically located in the reaction volume. A substrate such as a semiconductor wafer is positioned on the pedestal. One or more process gases are delivered to the reaction volume using a showerhead and plasma may be struck in the reaction volume. A film such as a dielectric layer is formed on the substrate.

The showerhead may be used in a capacitively coupled plasma (CCP) reactor. The showerhead distributes process gases over the substrate and serves as a radio-frequency (RF) electrode to drive the plasma. The showerhead is typically made of a metallic material. A metal electrode substantially reduces or eliminates an electric field inside a gas plenum of the showerhead to prevent plasma formation inside the showerhead and premature activation of gases.

The showerhead for CCP reactors is typically made of aluminum and includes a face plate that is welded to a body. The face plate of the showerhead typically has a plurality of spaced gas holes to provide uniform gas distribution over an exposed surface of the substrate. RF voltage may be applied to the showerhead, to another electrode (such as the pedestal), or to both.

Aluminum showerheads work well with many process chemistries (or gas compositions). However, aluminum is not compatible with process gases that leach elements from metallic surfaces. In particular, chlorine-based chemistry tends to leach aluminum at operating temperatures exceeding 300° C. As a result of the chemical attack of the chlorine-containing gas on the metal surface of the showerhead, the metallic material may end up in the film deposited on the substrate. This is often detrimental to device fabrication on the substrate. For example, in some instances the metallic materials are dopants that can compromise integrated device operation.

Undesirable metal contamination can also occur during cleaning of the processing chamber. Since atomic fluorine is commonly used for cleaning, the face plate (the hottest area of the showerhead) reacts with the fluorine and forms aluminum fluoride. When a thickness of aluminum fluoride increases with time, showerhead surface properties (e.g., roughness, conductivity and emissivity) change. As a result, the deposition process can drift and is also at high risk for particle contamination.

The design of the showerhead also does not permit cleaning inside of the showerhead (because it is welded) while the showerhead is installed in the processing chamber. In extreme cases, fluorination of the aluminum surface inside of the gas holes in the face plate may change the diameter of the holes and alter the uniformity of gas flow.

Some metallic materials such as aluminum become softer at higher temperatures (over 400° C.) and the face plate of the showerhead may start to droop. This can cause changes in gas flow and plasma density distribution.

SUMMARY

A showerhead assembly for a substrate processing system includes a back plate connected to a gas channel. A face plate is connected adjacent to a first surface of the back plate and includes a gas diffusion surface. An electrode is arranged in one of the back plate and the face plate and is connected to one or more conductors. A gas plenum is defined between the back plate and the face plate and is in fluid communication with the gas channel. The back plate and the face plate are made of a non-metallic material.

In other features, a stem is connected to the back plate and defines the gas channel. The one or more conductors pass through the stem.

In other features, the gas diffusion surface of the face plate includes spaced holes, the gas diffusion surface of the face plate includes perforations or the gas diffusion surface of the face plate is porous.

In other features, a plasma-suppressing structure is arranged adjacent to a second surface of the back plate. The first surface of the back plate is opposite to the second surface of the back plate.

In other features, the plasma-suppressing structure includes N plates located parallel to each other in a spaced relationship. N is an integer greater than one, and the N plates are made of a dielectric material.

In other features, the plasma-suppressing structure includes a collar extending from one of the N plates towards an upper surface of a processing chamber of the substrate processing system. The collar is made of a dielectric material.

In other features, N is greater than two and the N plates are spaced in a uniform manner. N is greater than two and at least some of the N plates are spaced in a non-uniform manner. At least one of the N plates includes a plurality of perforations. At least one of the N plates includes a saw tooth surface. The stem, the back plate and the face plate are made of a ceramic material. The stem, the back plate and the face plate are made of at least one of aluminum nitride and aluminum oxide.

In other features, the face plate is connected to the back plate to allow lateral movement of the face plate relative to the back plate while maintaining a seal therebetween.

In other features, a baffle is arranged between the gas channel and the gas plenum. A collar connects the stem to an upper surface of a substrate processing chamber. The back plate is connected to the face plate using fasteners. A height dimension of the gas plenum is less than twice an expected plasma sheath thickness. A first dimension between the electrode and the first surface of the back plate is less than a second dimension between the electrode and a second surface of the back plate. The first surface of the back plate is opposite to the second surface of the back plate. The electrode is disc-shaped.

In other features, a substrate processing system includes a processing chamber including a reaction volume. The showerhead assembly is arranged in the reaction volume. A pedestal is arranged in the reaction volume adjacent to the face plate.

In other features, a radio frequency (RF) circuit is configured to supply an RF signal to the one or more conductors having a frequency greater than 1 MHz. A controller is configured to control process gases flowing to the gas channel and to control operation of the RF circuit.

In other features, the one or more conductors include a cylindrically-shaped conductor that surrounds the gas channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
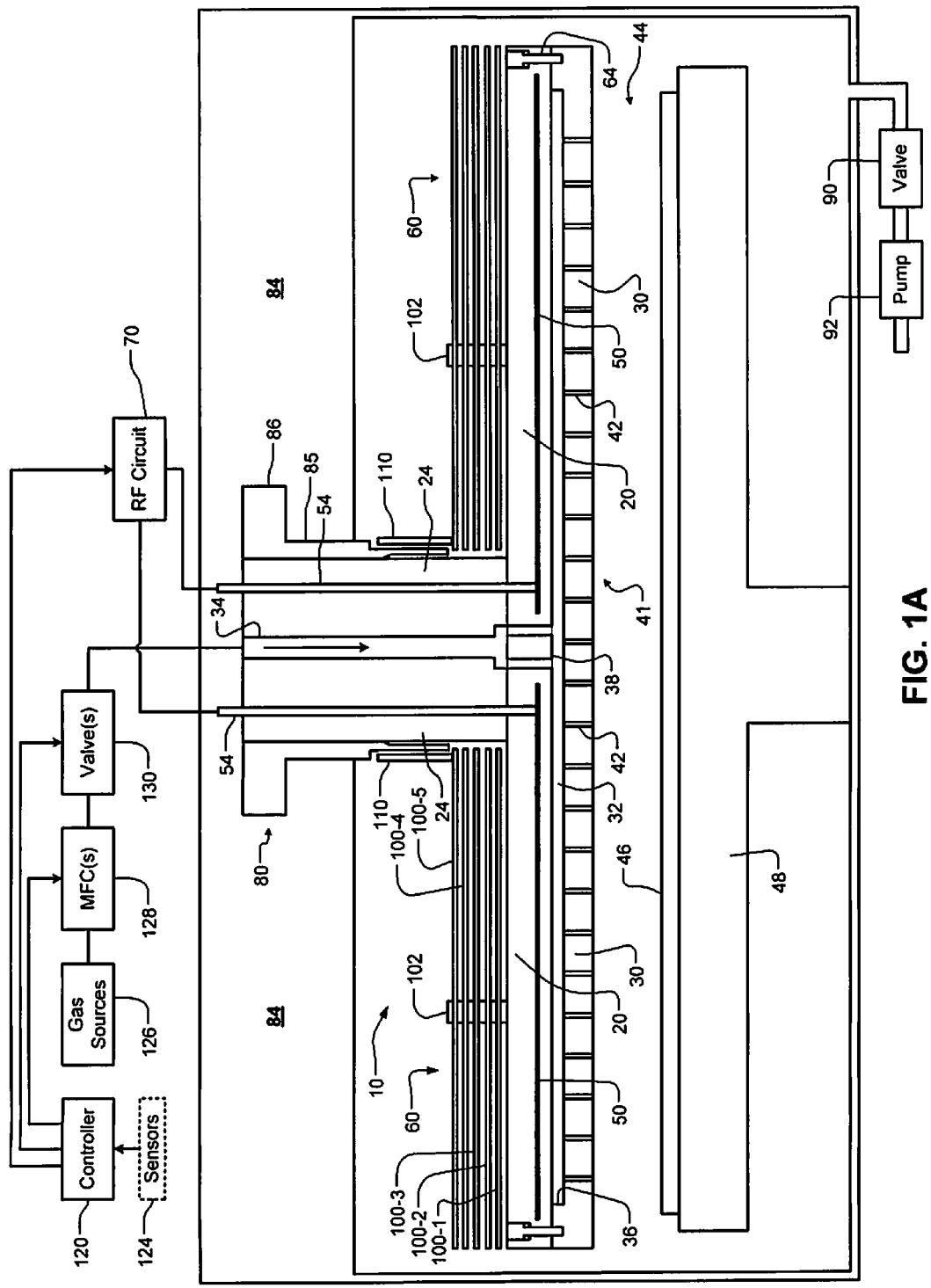
FIGS. 1A and 1B are functional block diagrams and simplified cross-sectional views of examples of substrate processing systems according to the present disclosure.
Figure 1B:
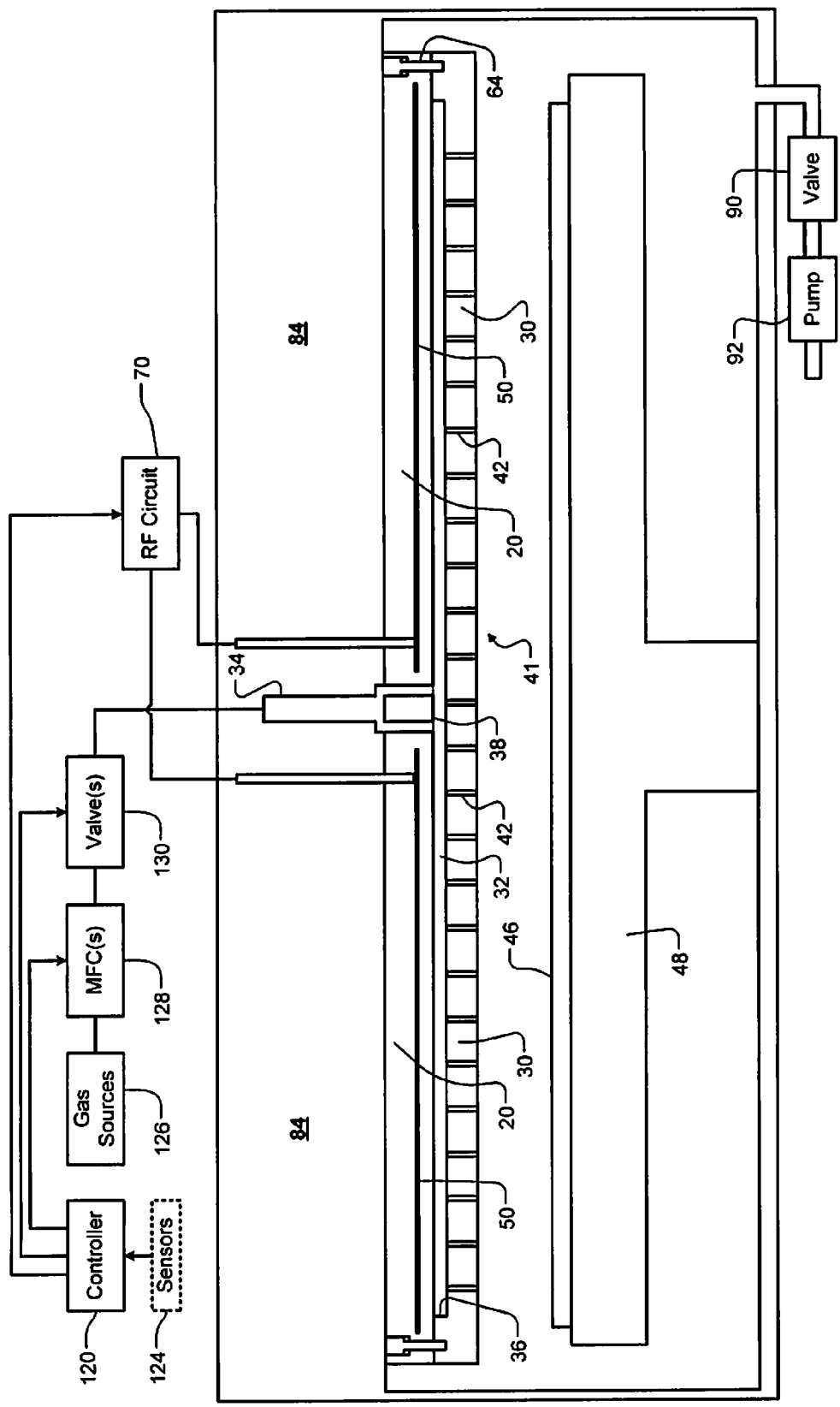

FIGS. 1A, 1B, 2A and 2B show examples of showerheads 10 according to the present disclosure. In FIG. 1A, the showerhead 10 includes a back plate 20, a stem 24 and a face plate 30. In some examples, the back plate 20, the stem 24 and the face plate 30 of the showerhead 10 are made of a non-metallic material such as a ceramic material. While the stem 24 is shown, the stem 24 can be omitted and the back plate can be arranged on, adjacent to and/or recessed into a surface of the process chamber (FIG. 1B). In some examples, the ceramic material includes aluminum nitride (AlN), aluminum oxide ($Al_2O_3$) or another suitable ceramic material.

In some examples, the back plate 20 includes a generally planar disc. The stem 24 is connected to the back plate 20. In some examples, the stem 24 is cylindrical and an axis of the stem 24 is connected perpendicular to a plane including the back plate 20. For example only, the stem 24 and the back plate 20 may be fixedly connected together using diffusion bonding or brazing. Alternately, the stem 24 and the back plate 20 may be removably connected using fasteners, male and female connectors or other methods.

The stem 24 defines a gas channel 34 that extends axially through the stem 24. Gas flows through the gas channel 34 onto an optional baffle 38 and into a gas plenum 32, which is defined between the back plate 20 and the face plate 30. One or both of the back plate 20 and the face plate 30 may include a recess 36 to define a height of the gas plenum 32.

The face plate 30 defines a gas diffusion surface 41 that acts as a gas diffuser between the gas plenum 32 and the reaction volume 44. The gas diffusion surface 41 can be perforated, have holes, be porous, etc. For example only in FIG. 1A, the process gas in the gas plenum 32 may flow through spaced holes 42 of the face plate 30 into a reaction volume 44. The spaced holes 42 distribute the process gases in a relatively uniform manner across an exposed surface of a substrate 46 arranged on a pedestal 48.

Figure 2A:
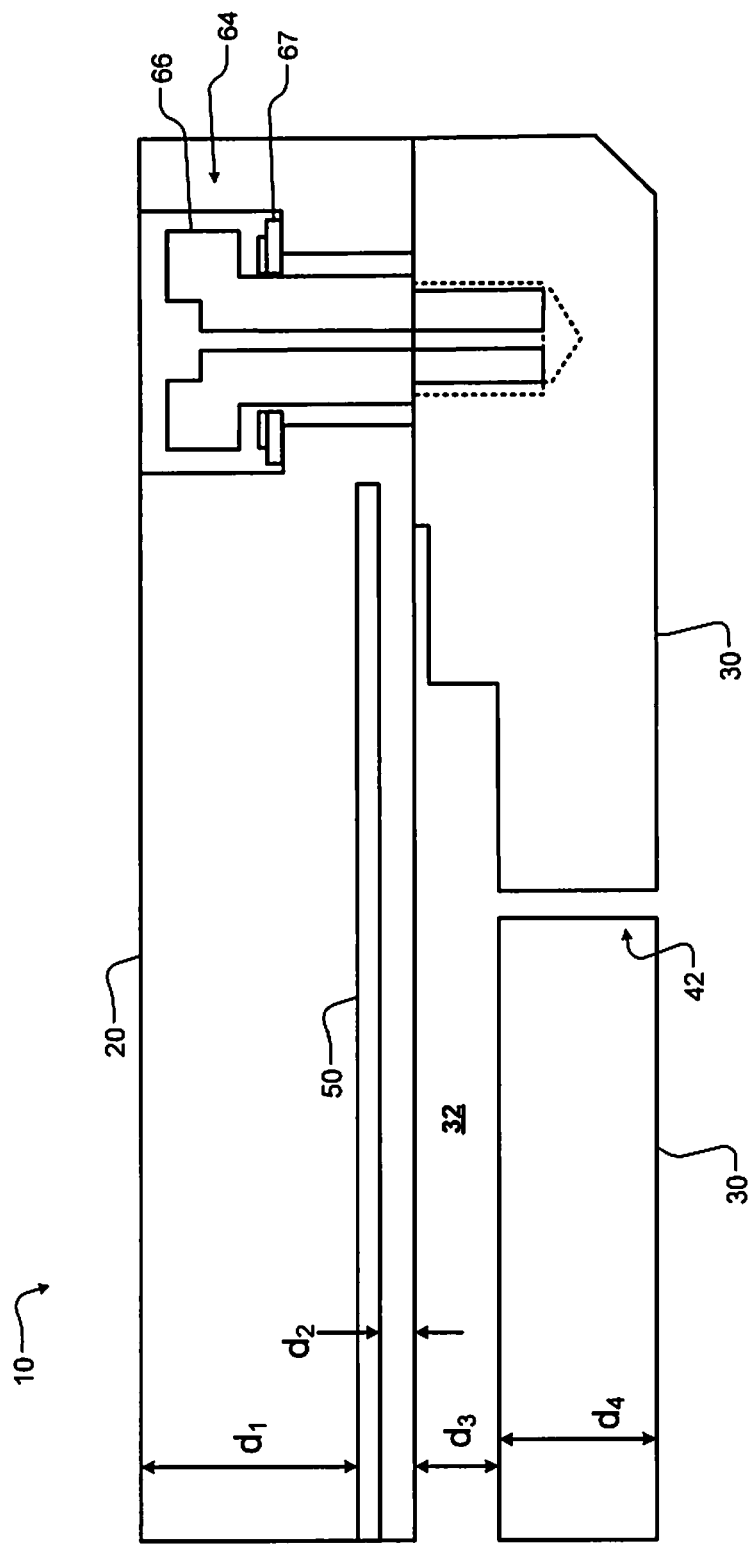
FIGS. 2A and 2B are a partial cross-sectional views of a portion of example showerheads according to the present disclosure.
Figure 2B:
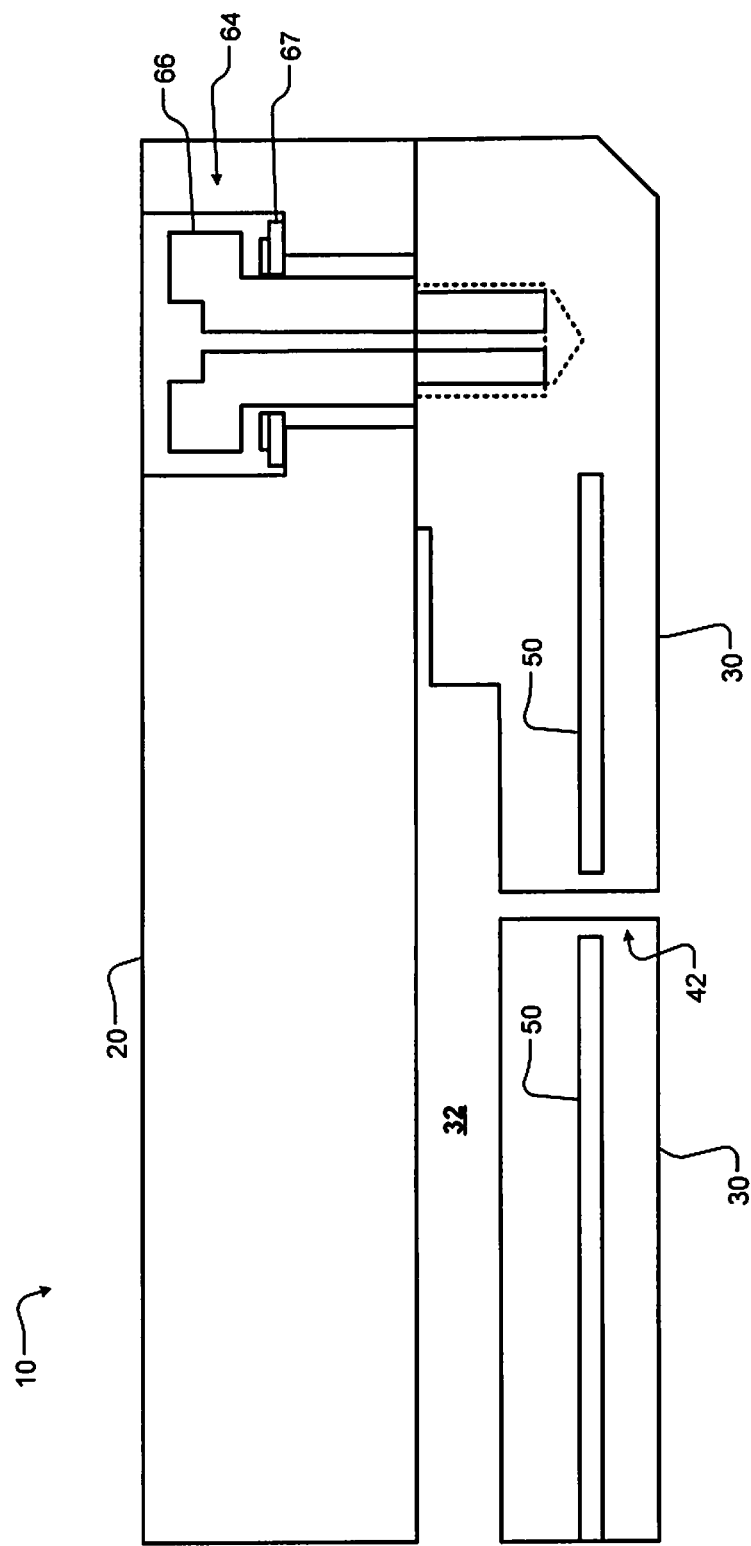

A radio frequency (RF) electrode 50 is embedded inside either the back plate 20 (FIGS. 1 and 2A) or the face plate 30 (FIG. 2B). One or more conductors or rods 54 pass through the stem 24 and part of the back plate 20. The conductors 54 are in electrical contact with the RF electrode 50. In some examples, four conductors 54 are used although additional or fewer conductors 54 may be used. The electric field along the gas channel 34 decreases as the number of rods increases. In some examples, the conductor 54 is cylindrical and surrounds the gas channel 34. The one or more conductors 54 may be connected to an RF voltage or to a reference potential such as ground if the showerhead 10 is configured as a grounded electrode.

The showerhead 10 includes a plasma-suppressing structure 60 that is arranged between a top surface of the back plate 20 and a top surface of the processing chamber to decrease or eliminate parasitic discharge driven through the back plate 20. In some examples, the plasma-suppressing structure 60 may be made in accordance with commonly-assigned "MECHANICAL SUPPRESSION OF PARASITIC PLASMA IN SUBSTRATE PROCESSING CHAMBER", U.S. patent application Ser. No. 13/303,386, filed on Nov. 23, 2011, which is hereby incorporated by reference in its entirety.

The stem 24 may be attached to a collar 80. The collar 80, in turn, may be attached to a top surface of the processing chamber. The collar 80 may include a stem 85 and a flange 86 that extends radially outward from the stem 85 adjacent to a top portion of the collar 80. The collar 80 may be made of a dielectric (insulating) material and may have dimensions (i.e. may have a thickness or height) that minimize capacitive coupling to ground. A valve 90 and pump 92 may be used to create a vacuum in the reaction volume 44.

The face plate 30 is attached to the back plate 20 in a manner to provide a gas seal and to allow some relative lateral movement therebetween due to differences in thermal expansion. As used herein, lateral movement refers to movement parallel to a plane including the face plate. In other words, the face plate 30 is mounted to the back plate 20 such that the face plate 30 can thermally expand without transmitting stress to the back plate 20 while simultaneously sealing gas/vapor inside the gas plenum 32.

As can be best seen in FIG. 2A, in some examples, edges of the back plate 20 and the face plate 30 are connected using fasteners 64. In some examples, the fasteners 64 include screws 66 that are preloaded with washers 67. The screws 66 may be rotated until a predetermined torque is applied to maintain contact between the face plate 30 and the back plate 20. In some examples, the fastener 64 may be a shoulder screw and the washer 67 may be a spring washer. The shoulder screw applies a predetermined compression to the spring washer to create a predefined load. In some examples, the face plate 30 of the showerhead 10 can be replaced by removing the fasteners 64, installing a new face plate and reinstalling fasteners 64.

In some examples, the spaced holes 42 in the face plate 30 have a diameter in the range from 0.02" to 0.06" to prevent plasma ignition inside of the spaced holes 42. The spaced holes 42 of the face plate 30 can be arranged in different patterns to optimize on-wafer film properties. The number of the spaced holes 42 can be in a range from 50 to 6000, although additional or fewer holes may be used. The diameter of the spaced holes 42 can be the same for a given face plate or two or more different sizes can be used for a given face plate.

In some examples, the RF electrode 50 that is embedded in the back plate 20 has a disc-shape and is made of metal that has a first coefficient of thermal expansion (CTE) that is comparable to a second CTE of the material used for the showerhead 10. As can be seen in FIG. 2B, the electrode 50 can be arranged in the face plate 30. As can be appreciated, the electrode 50 will be patterned in a manner to accommodate the pattern of spaced holes 42. The RF electrode 50 in the back plate 20 or faceplate 30 enables high frequency RF to pass through the gas plenum 32 of the showerhead 10 without lightup.

As can be best seen in FIG. 2A, in some examples, the RF electrode 50 is located as close as possible to a lower surface of the back plate 20 that faces the substrate to improve power coupling (dimension $d_2$ in FIG. 2A). In some examples, dimension $d_1$ is greater than dimension $d_2$. The conductors 54 are embedded in walls of the stem 24 to connect the RF electrode 50 to an RF circuit 70. In some examples, the conductors 54 are arranged to minimize the electric field along the channel through which gas is introduced. The face plate 30 may have any suitable thickness (dimension $d_4$).

When the RF electrode 50 is embedded in the back plate 20, the electric field that drives the discharge needs to pass through the gas plenum 32 and the face plate 30. In some examples, a height dimension of the gas plenum (dimension $d_3$ in FIG. 2A) is less than twice the expected plasma sheath thickness. Using this approach ensures that parasitic plasma discharge cannot be sustained. In some examples, the dimension $d_3$ is ⅛" or less to prevent conditions that would sustain parasitic plasma inside the gas plenum 32 and to minimize voltage drop across the gas plenum 32.

As can best be seen in FIG. 1A, when the RF electrode 50 is embedded inside the back plate 20, suppression of parasitic discharge on a back or top surface of the showerhead 10 may be performed using the plasma-suppressing structure 60. In some examples, the plasma-suppressing structure 60 includes two or more spaced plates 100-1, 100-2, . . . , and 100-N (collectively plates 100), where N is an integer greater than one. In some examples, N is equal to 5 although additional or fewer plates 100 may be used. In some examples, the plates 100 are made of a ceramic material or any other suitable dielectric material. Spacing between the plates 100 is optimized to prevent self-sustained discharge between the plates 100, and to drop significant voltage within the plasma-suppressing structure 60 so that parasitic discharge cannot be sustained behind the plasma-suppressing structure 60. One or more spacers 102 may be provided to define spacing between the plates 100 of the plasma-suppressing structure 60. A collar 110 may also be provided above a top one of the plates 100 (100-5 in the example in FIG. 1A) and around the stem 85 of the collar 80. The collar 110 may be made of a dielectric material.

A controller 120 may be connected to one or more sensors 124, which may be arranged both inside and outside of the processing chamber. The sensors 124 sense system operating conditions and may include pressure sensors, temperature sensors and/or other sensors. The controller 120 selectively supplies process gases to the gas channel 34 from gas sources 126 using one or more mass flow controllers (MFCs) 128 and valves 130.

In some examples, the RF electrode 50 is connected to the RF circuit 70, which provides high frequency excitation. In some examples, the high frequency excitation is greater than or equal to 1 MHz. The stacked layers of ceramic material and the gas plenum 32 create a capacitive structure that adds to the discharge impedance. As the excitation frequency increases, the impedance decreases. To provide efficient operation of the showerhead 10, most of the delivered power should be dissipated in a discharge above the substrate. Plasma behind the showerhead 10 is considered parasitic. In order to maximize power dissipation over the substrate, the impedance through the face plate 30 is smaller than the impedance through the back plate 20 (otherwise back side plasma may consume a significant fraction of delivered power). When the showerhead 10 includes the RF electrode 50 that is embedded in the back plate 20, more power tends to couple through the back plate 20. This behavior may be reduced using the plasma-suppressing structure 60.

Power coupling can be analyzed in terms of an impedance model. For the plasma discharge occurring in front of the face plate (that is, above the wafer), the impedance $Z_{face}$ is estimated as:

$$Z_{face} = \sum \frac{1}{2\pi f C_i} = \sum \frac{d_i}{2\pi f A \varepsilon_0 \varepsilon_i} = \frac{1}{2\pi f A \varepsilon_0} \sum \frac{d_i}{\varepsilon_i} = \frac{1}{2\pi f A \varepsilon_0} \left( \frac{d_2}{9} + d_3 + \frac{d_4}{9} \right),$$

Where $C_i$ is the capacitance of layer i, A is the area, f is the frequency, $d_i$ is a thickness of layer i, $\varepsilon_0$ is the permittivity, $\varepsilon_2 = \varepsilon_4 = 9$ which is dielectric constant of AlN or $Al_2O_3$, and $\varepsilon_3 = 1$ which is the dielectric constant of vacuum.

Since the dielectric constant of AlN and $Al_2O_3$ is about 9, the plates contribute much less to the impedance than vacuum gaps of similar thickness. For the plasma discharge occurring above the back side of the showerhead (a parasitic plasma), the impedance without the plasma-suppressing structure 60 is evaluated as $$Z_{back} = \frac{1}{2\pi f A \varepsilon_0} \cdot \frac{d_1}{9}.$$

For a showerhead without the plasma-suppressing structure 60, $Z_{face} > Z_{back}$ due to a high impedance of the gas plenum ($\varepsilon = 1$). To counteract, the plasma-suppressing structure 60 with a large impedance $Z_{supp}$ is installed on the back plate 20 to insure $Z_{face} \ll Z_{back} + Z_{supp}$.

The impedance of the plasma-suppressing structure 60 depends mostly on vacuum gaps between the plates 100. If the gaps are too wide, however, capacitive parasitic discharge may occur between the plates 100.

The impedance model applied above assumes parallel plate capacitors and uniform electric fields. In reality, fringe fields will occur which will alter the above results but this effect is expected to be small. The fringe fields are the highest in the immediate vicinity of the RF electrode 50. As a result, a first gap (between the back plate 20 and the first plate 100-1 of the plasma-suppressing structure 60) is the most prone to ignite parasitic discharge.

Figure 3:
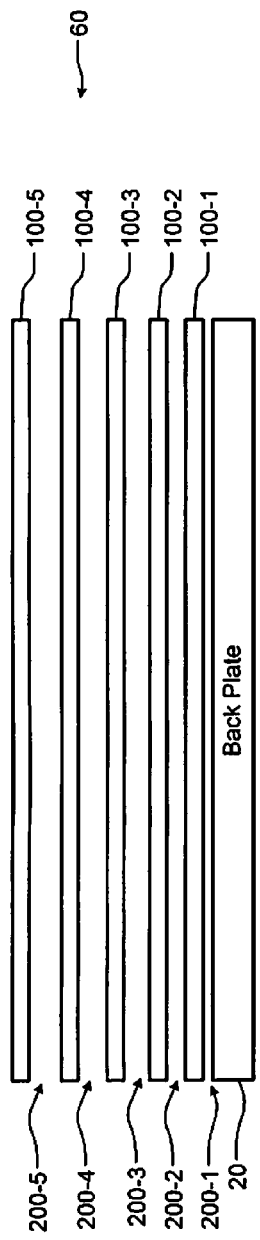
FIG. 3 illustrates an example of non-uniform spacing between plates of a plasma-suppressing structure.

In some examples, the inter-plate gaps are uniform. In other examples, the inter-plate gaps are not uniform. For example only in FIG. 3, some or all of inter-plate gaps 200-1, 200-2, 200-3, 200-4 and 200-5 (collectively inter-plate gaps 200) may increase with a distance from the back plate 20. For example only, the inter-plate gaps 200 may increase as follows 40-60-100-150-200 (in mils), although other values may be used. As can be appreciated, ends of the plates 100 may be enclosed for example using one or more plugs (not shown).

Figure 4:
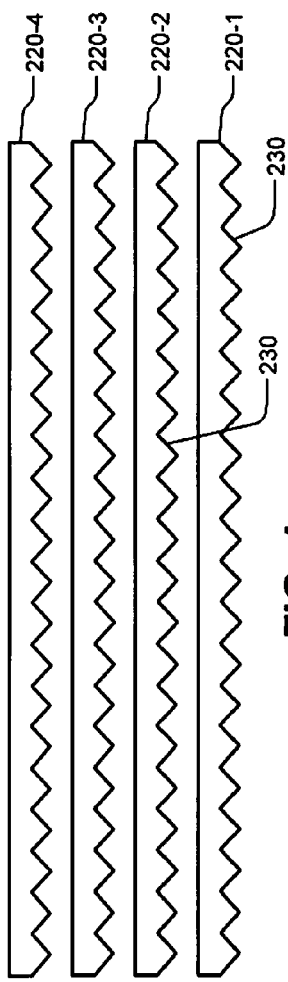
FIG. 4 illustrates an example of scalloped surfaces on the plates of a plasma-suppressing structure.

Preventing inter-plate parasitic discharge between the plates 100 of the plasma-suppressing structure 60 relies on the relation of gap width and plasma sheath thickness. For example in FIG. 4, improved protection against undesired ignition may be achieved by plates 220-1, 220-2, 220-3 and 220-4 (collectively plates 220) that include one or more saw tooth or scalloped surfaces 230. While only one scalloped surface 230 is shown for each of the plates 220, both surfaces of each plate 220 may be scalloped. High surface area provides more recombination sites for ions and electrons which increases their loss rate and makes a self-sustained parasitic discharge less likely. As can be appreciated, ends of the plates 220 may be enclosed for example using one or more plugs (not shown).

Figure 5:
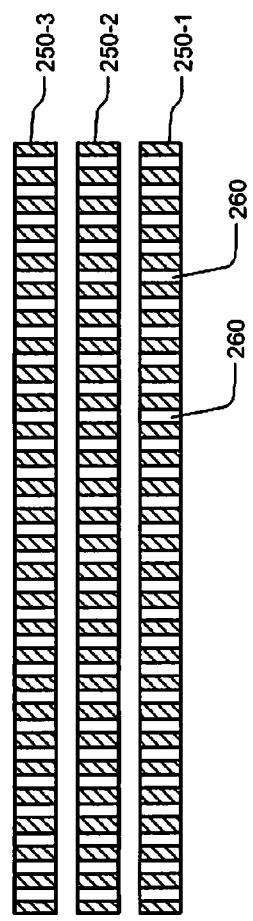
FIG. 5 illustrates an example of perforated plates of a plasma-suppressing structure.

For example in FIG. 5, improved protection against undesired ignition may be achieved by plates 250-1, 250-2 and 250-3 (collectively plates 250) each including one or more perforations 260. High surface area provides more recombination sites for ions and electrons which increases their loss rate and makes a self-sustained parasitic discharge less likely. As can be appreciated, ends of the plates 250 may be enclosed for example using one or more plugs (not shown).

As can be appreciated, the plasma-suppressing structure 60 for a given substrate processing chamber may include variations of the above described features such as uniform and non-uniform spacing, one or more scalloped surfaces, and/or perforations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A showerhead assembly for a substrate processing system, comprising:
   back plate connected to a gas channel;
   a face plate connected adjacent to a first surface of the back plate and including a gas diffusion surface;
   one or more conductors; and
   an electrode embedded within the back plate and connected to the one or more conductors,
   wherein at least one of a bottom surface of the back plate and a top surface of the face plate includes a recess such that a gas plenum (i) is defined in the recess between the back plate and the face plate below the electrode and (ii) is in fluid communication with the gas channel, and
   wherein the back plate and the face plate are made of a non-metallic material.

2. The showerhead assembly of claim 1, further comprising
   a stem connected to the back plate and defining the gas channel,
   wherein the stem is made of a non-metallic material, and
   wherein the one or more conductors pass through the stem.

3. The showerhead assembly of claim 1, wherein one of:
   the gas diffusion surface of the face plate includes spaced holes;
   the gas diffusion surface of the face plate includes perforations; or
   the gas diffusion surface of the face plate is porous.

4. The showerhead assembly of claim 2, further comprising a plasma-suppressing structure arranged adjacent to a second surface of the back plate, wherein the first surface of the back plate is opposite to the second surface of the back plate.

5. The showerhead assembly of claim 4, wherein the plasma-suppressing structure includes N plates located parallel to each other in a spaced relationship, where N is an integer greater than one, wherein the N plates are made of a dielectric material.

6. The showerhead assembly of claim 5, wherein the plasma-suppressing structure includes a collar extending from one of the N plates towards an upper surface of a processing chamber of the substrate processing system, and wherein the collar is made of a dielectric material.

7. The showerhead assembly of claim 5, wherein N is greater than two and the N plates are spaced in a uniform manner.

8. The showerhead assembly of claim 5, wherein N is greater than two and at least some of the N plates are spaced in a non-uniform manner.

9. The showerhead assembly of claim 5, wherein at least one of the N plates includes a plurality of perforations.

10. The showerhead assembly of claim 5, wherein at least one of the N plates includes a saw tooth surface.

11. The showerhead assembly of claim 2, wherein the stem, the back plate and the face plate are made of a ceramic material.

12. The showerhead assembly of claim 2, wherein the stem, the back plate and the face plate are made of at least one of aluminum nitride and aluminum oxide.

13. The showerhead assembly of claim 1, further comprising a baffle arranged between the gas channel and the gas plenum.

14. The showerhead assembly of claim 2, further comprising a collar connecting the stem to an upper surface of a substrate processing chamber.

15. The showerhead assembly of claim 1, wherein the face plate is connected to the back plate to allow lateral movement of the face plate relative to the back plate while maintaining a seal therebetween.

16. The showerhead assembly of claim 1, wherein a height dimension of the gas plenum is less than twice an expected plasma sheath thickness.

17. The showerhead assembly of claim 1, wherein a first dimension between the electrode and the first surface of the back plate is less than a second dimension between the electrode and a second surface of the back plate, wherein the first surface of the back plate is opposite to the second surface of the back plate.

18. The showerhead assembly of claim 1, wherein the electrode is disc-shaped.

19. The showerhead assembly of claim 2, wherein the one or more conductors includes a cylindrically-shaped conductor that surrounds the gas channel.

20. A substrate processing system comprising:
 a processing chamber including a reaction volume;
 the showerhead assembly of claim 1 arranged in the reaction volume; and
 a pedestal arranged in the reaction volume adjacent to the face plate.

21. The substrate processing system of claim 20, further comprising:
 a radio frequency (RF) circuit configured to supply an RF signal to the one or more conductors having a frequency greater than 1 MHz; and
 a controller configured to control process gases flowing to the gas channel and to control operation of the RF circuit.

22. The substrate processing system of claim 21, wherein the back plate is directly connected to a wall of the processing chamber.

* * * * *